US011770932B2

(12) United States Patent
Liu et al.

(10) Patent No.: US 11,770,932 B2
(45) Date of Patent: Sep. 26, 2023

(54) METHODS OF FORMING MICROELECTRONIC DEVICES

(71) Applicant: Micron Technology, Inc., Boise, ID (US)

(72) Inventors: Haitao Liu, Boise, ID (US); Kunal R. Parekh, Boise, ID (US)

(*) Notice: Subject to any disclaimer, the term of this patent is extended or adjusted under 35 U.S.C. 154(b) by 0 days.

(21) Appl. No.: 18/045,417

(22) Filed: Oct. 10, 2022

(65) Prior Publication Data
US 2023/0057745 A1   Feb. 23, 2023

Related U.S. Application Data

(62) Division of application No. 17/062,222, filed on Oct. 2, 2020, now Pat. No. 11,482,538.

(51) Int. Cl.
*H01L 21/00* (2006.01)
*H10B 43/27* (2023.01)
(Continued)

(52) U.S. Cl.
CPC ....... *H10B 43/27* (2023.02); *H01L 21/28537* (2013.01); *H01L 29/47* (2013.01);
(Continued)

(58) Field of Classification Search
CPC ........ H10B 43/27; H10B 43/40; H10B 41/27; H01L 21/28537; H01L 29/47
See application file for complete search history.

(56) References Cited

U.S. PATENT DOCUMENTS 4,214,256 A   7/1980   Dalal et al.
4,408,216 A   10/1983   Gould
(Continued)

FOREIGN PATENT DOCUMENTS

KR   10-2015-0047285 A   5/2015

OTHER PUBLICATIONS

Caillat et al., 3DNand GIDL—Assisted Body Biasing for Erase Enabling CMOS Under Array (CUA) Architecture, 2017 IEEE International Memory workshop (IMW) May 14-17, 2017, 4 pages.
(Continued)

*Primary Examiner* — Richard A Booth
(74) *Attorney, Agent, or Firm* — TraskBritt (57) ABSTRACT

A microelectronic device comprises a stack structure, cell pillar structures, an active body structure, digit line structures, and control logic devices. The stack structure comprises vertically neighboring tiers, each of the vertically neighboring tiers comprising a conductive structure and an insulative structure vertically neighboring the conductive structure. The cell pillar structures vertically extend through the stack structure and each comprise a channel material and an outer material stack horizontally interposed between the channel material and the stack structure. The active body structure vertically overlies the stack structure and is in contact with the channel material of the cell pillar structures. The active body structure comprises a metal material having a work function greater than or equal to about 4.7 electron-volts. The digit line structures vertically underlie the stack structure and are coupled to the cell pillar structures. Memory devices, electronic systems, and methods of forming a microelectronic device are also described.

20 Claims, 5 Drawing Sheets

(51) Int. Cl.
　　　*H01L 29/47*　　　(2006.01)
　　　*H01L 21/285*　　(2006.01)
　　　*H10B 41/27*　　　(2023.01)
　　　*H10B 41/41*　　　(2023.01)
　　　*H10B 43/40*　　　(2023.01)

(52) U.S. Cl.
　　　CPC ............. *H10B 41/27* (2023.02); *H10B 41/41* (2023.02); *H10B 43/40* (2023.02)

(56) References Cited

U.S. PATENT DOCUMENTS

| | | | |
|---|---|---|---|
| 5,536,967 | A | 7/1996 | Yokoyama |
| 6,353,251 | B1 | 3/2002 | Kimura |
| 6,744,111 | B1 | 6/2004 | Wu |
| 7,383,476 | B2 | 6/2008 | Crowley et al. |
| 9,202,871 | B2 | 12/2015 | Mouli |
| 9,595,336 | B2 | 3/2017 | Rhie |
| 2010/0163968 | A1 | 7/2010 | Kim et al. |
| 2014/0293701 | A1 | 10/2014 | Dong et al. |
| 2015/0008505 | A1 | 1/2015 | Chien et al. |
| 2015/0349073 | A1 | 12/2015 | Kang |
| 2017/0317141 | A1 | 11/2017 | Bedau |
| 2019/0067475 | A1 | 2/2019 | Liu et al. |
| 2020/0013798 | A1 | 1/2020 | Parekh |
| 2020/0083245 | A1 | 3/2020 | Fayrushin et al. |
| 2020/0185406 | A1 | 6/2020 | Li et al. |
| 2021/0398945 | A1* | 12/2021 | Parekh .................... H01L 25/18 |
| 2022/0139821 | A1 | 5/2022 | Hwang et al. |
| 2022/0157719 | A1* | 5/2022 | Luo .................. H01L 21/31144 |

OTHER PUBLICATIONS

International Search Report for International Application No. PCT/US2021/048989, dated Jun. 13, 2022, 3 pages.

International Written Opinion for International Application No. PCT/US2021/048989, dated Jun. 13, 2022, 4 pages.

Taiwanese Search Report and Office Action from Taiwanese Application No. 110134313, dated Jul. 8, 2022, 9 pages with English translation.

* cited by examiner

METHODS OF FORMING MICROELECTRONIC DEVICES

CROSS-REFERENCE TO RELATED APPLICATION

This application is a divisional of U.S. patent application Ser. No. 17/062,222, filed Oct. 2, 2020, now U.S. Pat. No. 11,482,538, issued Oct. 25, 2022, the disclosure of each of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, electronic systems, and additional methods.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a control logic region of a memory device underlying or overlying a memory array of the memory device (e.g., a non-volatile memory device) have been used to control operations (e.g., access operations, read operations, write operations, erase operations) on the memory cells of the memory device. An assembly of the control logic devices may be provided in electrical communication with the memory cells of the memory array by way of routing and interconnect structures. However, processing conditions (e.g., temperatures, pressures, materials) and/or designs for the formation of the memory array over the control logic region can limit the configurations and performance of the control logic devices within the control logic region; or processing conditions and/or designs for the formation of the control logic region outside horizontal boundaries of the memory array can limit the configurations and performance of features of the memory array. In addition, conventional memory device configurations can also be complex and costly to manufacture, can impede reductions to the size (e.g., horizontal footprint) of a memory device, and/or can impede improvements in the performance (e.g., faster memory cell ON/OFF speed, lower threshold switching voltage requirements, faster data transfer rates, lower power consumption) of the memory device.

DETAILED DESCRIPTION

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1D are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used to form various devices and electronic systems.

Figure 1A:
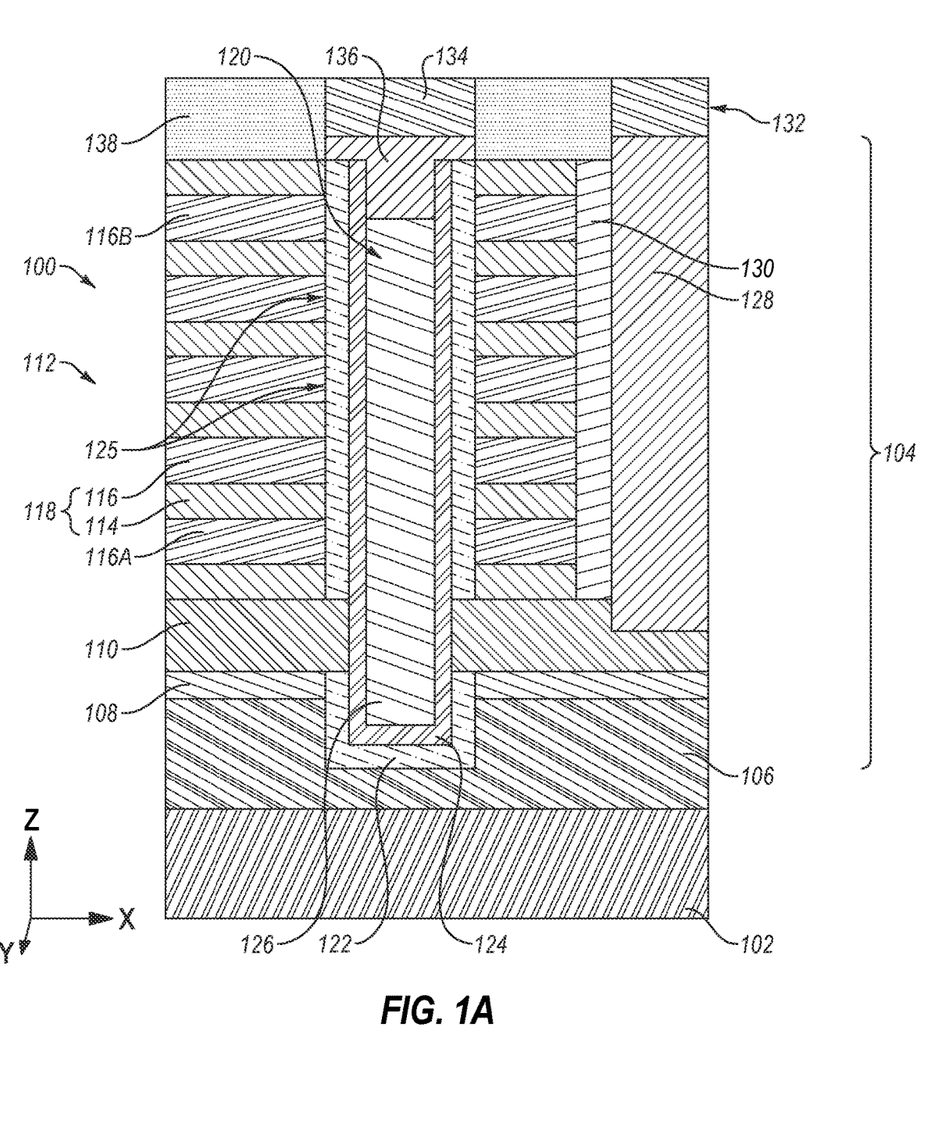
FIGS. 1A through 1D are simplified, partial cross-sectional views illustrating a method of forming a microelectronic device, in accordance with embodiments of the disclosure.

Referring to FIG. 1A, a microelectronic device structure 100 may be formed to include a base structure 102 (e.g., a carrier wafer), and a memory array region 104 over the base structure 102. The memory array region 104 includes a conductive material 106 on or over the base structure 102; a first isolation material 108 on or over the conductive material 106; at least one lateral contact structure 110 on or over the first isolation material 108; a stack structure 112 on or over the lateral contact structure 110; cell pillar structures 120 vertically extending (e.g., in the Z-direction) through the stack structure 112, the lateral contact structure 110, and the first isolation material 108 and into the conductive material 106; deep contact structures 128 vertically extending (e.g., in the Z-direction) through the stack structure 112 and to or into the lateral contact structure 110; at least one conductive routing tier 132 overlying the stack structure 112, and including conductive line structures 134 coupled to the cell pillar structures 120; and a second isolation material 138 on or over the stack structure 112 and at least partially surrounding (e.g., horizontally surrounding) the conductive line structures 134. The microelectronic device structure 100 (including the base structure 102 and the memory array region 104 thereof) also includes additional features (e.g., structures, materials, devices), as described in further detail below.

The base structure 102 of the microelectronic device structure 100 comprises a base material or construction upon which additional features (e.g., materials, structures, devices) of the microelectronic device structure 100 are formed. The base structure 102 may, for example, be formed of and include one or more of semiconductive material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductive material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; α-$Al_2O_3$), and silicon carbide). The base structure 102 may be configured to facilitate safe handling of the microelectronic device structure 100 for subsequent attachment to a second microelectronic device structure, as described in further detail below. In some embodiments the base structure 102 comprises a wafer. By way of non-limiting example, the base structure 102 may comprise a semiconductive wafer (e.g., a silicon wafer), a glass wafer, or a ceramic wafer. The base structure 102 may include one or more layers, structures, and/or regions formed therein and/or thereon.

The conductive material 106 may be selected to have a relatively lower etching rate than the base structure 102 during mutual (e.g., common) exposure to at least one etchant (e.g., at least one wet etchant). The conductive material 106 may for example, be employed as a so-called "etch stop" material during subsequent processing acts to remove (e.g., etch away) the base structure 102, as described in further detail below. In some embodiments, the conductive material 106 comprises a conductively doped semiconductive material comprising at least one semiconductive material (e.g., one or more of a silicon material, such as monocrystalline silicon or polycrystalline silicon; a silicon-germanium material; a germanium material; a gallium arsenide material; a gallium nitride material; and an indium phosphide material) doped (e.g., impregnated) with one or more desirable conductivity-enhancing dopants (e.g., one or more N-type dopants, one or more P-type dopants). If the conductive material 106 and the base structure 102 are each formed of and include a semiconductive material, a material composition of the semiconductive material of the conductive material 106 may be substantially the same as material composition of the semiconductive material of the base structure 102 (e.g., conductive material 106 and the base structure 102 may each comprise polycrystalline silicon, but the polycrystalline silicon of the conductive material 106 may be doped with one or more conductivity-enhancing dopants absent from the polycrystalline silicon of the base structure 102); or the material composition of the semiconductive material of the conductive material 106 may be different than the material composition of the semiconductive material of the base structure 102. In some embodiments, the conductive material 106 comprises silicon (e.g., monocrystalline silicon, polycrystalline silicon) doped with at least one P-type dopant (e.g., one or more of boron, aluminum, and gallium). In additional embodiments, the conductive material 106 comprise silicon (e.g., monocrystalline silicon, polycrystalline silicon) doped with at least one N-type dopant (e.g., one or more of phosphorus, arsenic, antimony, and bismuth).

The first isolation material 108 may be formed of and include at least one insulative material. By way of non-limiting example, the first isolation material 108 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the first isolation material 108 is formed of and includes at least one dielectric oxide material (e.g., $SiO_x$, such as silicon dioxide ($SiO_2$)). The first isolation material 108 may be substantially homogeneous, or the first isolation material 108 may be heterogeneous.

The lateral contact structure 110 may be formed of and include conductive material. As a non-limiting example, the lateral contact structure 110 may be formed of and include at least one semiconductive material (e.g., one or more of a silicon material, such as monocrystalline silicon or polycrystalline silicon; a silicon-germanium material; a germanium material; a gallium arsenide material; a gallium nitride material; and an indium phosphide material) doped (e.g., impregnated) with one or more desirable conductivity-enhancing dopant(s) (e.g., one or more N-type dopants, one or more P-type dopants). In some embodiments, the lateral contact structure 110 comprises silicon (e.g., monocrystalline silicon, polycrystalline silicon) doped with at least one N-type dopant (e.g., one or more of phosphorus, arsenic, antimony, and bismuth). In additional embodiments, the lateral contact structure 110 comprises silicon (e.g., monocrystalline silicon, polycrystalline silicon) doped with at least one P-type dopant (e.g., one or more of boron, aluminum, and gallium). If the lateral contact structure 110 comprises a doped semiconductive material, a material composition of the lateral contact structure 110 may be different than a material composition of the conductive material 106, or the material composition of the lateral contact structure 110 may be substantially the same as the material composition of the conductive material 106. In some embodiments, the conductive material 106 comprises polysilicon doped with at least one P-type dopant, and the lateral contact structure 110 comprises polysilicon doped with at least one N-type dopant. In further embodiments, the lateral contact structure 110 is formed of and includes one or more of a metal, an alloy, and a conductive metal-containing material (e.g., a conductive metal nitride, a conductive metal silicide, a conductive metal carbide, a conductive metal oxide). The lateral contact structure 110 may effectively serve as and/or may otherwise be in electrical communication with at least one source structure (e.g., a source line, a source plate) of the microelectronic device structure 100.

Still referring to FIG. 1A, the stack structure 112 within the memory array region 104 includes a vertically alternating (e.g., in the Z-direction) sequence of insulative structures 114 and conductive structures 116 arranged in tiers 118. Each of the tiers 118 of the stack structure 112 may include at least one of the conductive structures 116 vertically neighboring at least one of the insulative structures 114. In some embodiments, the conductive structures 116 are formed of and include tungsten (W) and the insulative structures 114 are formed of and include silicon dioxide ($SiO_2$). In additional embodiments, the conductive structures 116 are formed of and include a different conductive material (e.g., semiconductive material doped with at least one conductivity-enhancing dopant; a different metal; an alloy; a conductive metal-containing material), and/or the insulative structures 114 are formed of and include a different insulative material (e.g., a different dielectric oxide material, a dielectric nitride material, a dielectric oxynitride material, a dielectric oxycarbide material, a hydrogenated dielectric oxycarbide material, a dielectric carboxynitride material). The conductive structures 116 and insulative structures 114 of the tiers 118 of the stack structure 112 may each individually be substantially planar, and may each individually exhibit a desired thickness (e.g., vertical dimension in the Z-direction). As shown in FIG. 1A, the insulative structure 114 of a vertically lowermost tier 118 of the stack structure 112 may be vertically interposed between the lateral contact structure 110 and the conductive structure 116 of the vertically lowermost tier 118 of the stack structure 112.

Optionally, one or more liner materials (e.g., insulative liner material(s), conductive liner material(s)) may be formed around the conductive structures 116 of the stack structure 112. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 116. In some embodiments, the liner material(s) comprise titanium nitride. In further embodiments, the liner material(s) further includes aluminum oxide. As a non-limiting example, aluminum oxide may be formed directly adjacent the insulative structures 114, titanium nitride may be formed directly adjacent the aluminum oxide, and tungsten may be formed directly adjacent the titanium nitride. For clarity and ease of understanding the description, the liner material(s) are not illustrated in FIG. 1A, but it will be understood that the liner material(s) may be disposed around the conductive structures 116.

At least one vertically lower (e.g., in the Z-direction) conductive structure 116 of the stack structure 112 may be employed as at least one first select gate (e.g., at least one source side select gate (SGS)) of the memory array region 104. In some embodiments, a first conductive structure 116A of a vertically lowermost tier 118 of the stack structure 112 is employed as a first select gate (e.g., a SGS) of the memory array region 104. In addition, one or more vertically upper (e.g., in the Z-direction) conductive structures 116 of the stack structure 112 may be employed as second select gate(s) (e.g., drain side select gate(s) (SGDs)) of the memory array region 104. In some embodiments, horizontally neighboring (e.g., in the Y-direction) conductive structures 116 of a vertically uppermost tier 118 of the stack structure 112 are employed as second select gates (e.g., SGDs) of the memory array region 104.

With continued reference to FIG. 1A, the cell pillar structures 120 may each individually be formed of and include multiple (e.g., a plurality) materials facilitating the formation of vertically extending (e.g., in the Z-direction) strings of memory cells 125 within the memory array region 104. By way of non-limiting example, each of the cell pillar structures 120 may individually be formed to include an outer material stack 122, a channel material 124 inwardly horizontally adjacent the outer material stack 122, and a fill material 126 inwardly horizontally adjacent the channel material 124.

The outer material stack 122 of each of the cell pillar structures 120 may include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); and a tunnel dielectric material, such as a second oxide dielectric material (e.g., $SiO_x$, such as $SiO_2$). The tunnel dielectric material may be outwardly horizontally surrounded by the charge-trapping material; and the charge-trapping material may be outwardly horizontally surrounded by the charge-blocking material. In some embodiments, the outer material stack 122 of each of the cell pillar structures 120 comprises an oxide-nitride-oxide (ONO) stack.

The channel material 124 of each of the cell pillar structures 120 may be formed of and include one or more of a semiconductive material and an oxide semiconductive material. In some embodiments, the channel material 124 is formed of and includes at least one semiconductive material, such as polycrystalline silicon. In some embodiments, the channel material 124 comprises a semiconductive material (e.g., polycrystalline silicon) doped with at least one P-type dopant (e.g., one or more of boron, aluminum, and gallium) or at least one N-type dopant (e.g., one or more of phosphorus, arsenic, antimony, and bismuth), at an atomic dopant concentration less than or equal to about 1.0e17 dopant atoms per cubic centimeter. In additional embodiments, the channel material 124 comprises a semiconductive material (e.g., polycrystalline silicon) doped with at least one P-type dopant or at least one N-type dopant, at an atomic concentration greater than about 1.0e17 dopant atoms per cubic centimeter. In further embodiments, the channel material 124 comprises an undoped semiconductive material (e.g., undoped polycrystalline silicon). In still further embodiments the channel material 124 is formed of at least one oxide semiconductive material having a band gap larger than that polycrystalline silicon, such as a band gap larger than 1.65 electronvolts (eV). By way of non-limiting example, the channel material 124 may be formed of and include one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. The channel material 124 may be substantially homogeneous, or the channel material 124 may be heterogeneous. As shown in FIG. 1A, the channel material 124 of each cell pillar structure 120 may be outwardly horizontally surrounded by the outer material stack 122 (e.g., tunnel dielectric material of the outer material stack 122) of the cell pillar structure 120.

The fill material 126 of each of the cell pillar structures 120 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and air. In some embodiments, the fill material 126 is formed of and includes at least one dielectric oxide material (e.g., $SiO_x$, such as $SiO_2$). In additional embodiments, the fill material 126 is formed of and includes at least one dielectric nitride material (e.g., $SiN_y$, such as $Si_3N_4$). The fill material 126 may be substantially homogeneous, or the fill material 126 may be heterogeneous. As shown in FIG. 1A, the fill material 126 of each cell pillar structure 120 outwardly horizontally surrounded by the channel material 124 of the cell pillar structure 120.

As shown in FIG. 1A, lower vertical boundaries (e.g., in the Z-direction) of the cell pillar structures 120 may be positioned within vertical boundaries of the conductive material 106. The outer material stack 122 (e.g., the charge-trapping material thereof) of each cell pillar structure 120 may physically contact the conductive material 106 at outer horizontal boundaries and lower vertical boundaries of the cell pillar structure 120. The outer material stack 122 (e.g., the charge-trapping material thereof) of each cell pillar structure 120 may also physically contact the first isolation material 108 and the stack structure 112 (including the insulative structures 114 and the conductive structures 116 thereof) at outer horizontal boundaries of the cell pillar structure 120. In addition, the channel material 124 of each cell pillar structure 120 may be coupled to the lateral contact structure 110. The lateral contact structure 110 may, for example, horizontally extend (e.g., in the X-direction, in the Y-direction) through the outer material stack 122 of each cell pillar structure 120, and may physically contact the channel material 124 of the cell pillar structure 120 at outer horizontal boundaries of the channel material 124.

Intersections of the cell pillar structures 120 and the conductive structures 116 of the tiers 118 of the stack structure 112 may define vertically extending strings of memory cells 125 coupled in series with one another within the memory array region 104 of the microelectronic device structure 100. In some embodiments, the memory cells 125 formed at the intersections of the conductive structures 116 and the cell pillar structures 120 within each the tiers 118 of the stack structure 112 comprise so-called "MONOS" (metal-oxide-nitride-oxide-semiconductor) memory cells. In additional embodiments, the memory cells 125 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures 120 and the conductive structures 116 of the different tiers 118 of the stack structure 112.

Still referring to FIG. 1A, the deep contact structures 128 may vertically terminate (e.g., vertically end) at or within vertical boundaries of the lateral contact structure 110. The deep contact structures 128 may be configured and positioned to electrically connect one or more features (e.g., structures, materials, devices) of the microelectronic device structure 100 vertically overlying the stack structure 112 with the lateral contact structure 110 (and, hence, one or more other features coupled to the lateral contact structure 110) vertically underlying the stack structure 112. The deep contact structures 128 may be formed of and include conductive material. In some embodiments, the deep contact structures 128 comprise a doped semiconductive material, such as silicon (e.g., polycrystalline silicon) doped with at least one N-type dopant (e.g., one or more of phosphorus, arsenic, antimony, and bismuth) or at least one P-type dopant (e.g., one or more of boron, aluminum, and gallium). If the deep contact structures 128 comprise a doped semiconductive material, a material composition of the deep contact structures 128 may be different than a material composition of the lateral contact structure 110, or the material composition of the deep contact structures 128 may be substantially the same as the material composition of the lateral contact structure 110. In additional embodiments, the deep contact structures 128 are formed of and include one or more of a metal, an alloy, and a conductive metal-containing material (e.g., a conductive metal nitride, a conductive metal silicide, a conductive metal carbide, a conductive metal oxide).

The deep contact structures 128 may be electrically isolated from the conductive structures 116 of the tiers 118 of the stack structure 112 by way of insulative liner structures 130 formed to horizontally intervene between the deep contact structures 128 and the stack structure 112. The insulative liner structures 130 may continuously extend over and substantially cover side surfaces of the deep contact structures 128. The insulative liner structures 130 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$, at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative liner structures 130 is formed of and includes at least one dielectric oxide material (e.g., $SiO_x$, such as $SiO_2$).

Still referring to FIG. 1A, conductive line structures 134 of the conductive routing tier 132 may be positioned vertically over and in electrical communication with the cell pillar structures 120 (and, hence, the vertically extending strings of memory cells 125) and the deep contact structures 128. At least some of the conductive line structures 134 may be employed as digit line structures (e.g., bit line structures, data line structures) for the memory array region 104 of the microelectronic device structure 100. The conductive line structures 134 may exhibit horizontally elongate shapes extending in parallel in a first horizontal direction (e.g., the Y-direction). As used herein, the term "parallel" means substantially parallel. Conductive line structures 134 may each exhibit substantially the same dimensions (e.g., width in the X-direction, length in a Y-direction, height in the Z-direction), shape, and spacing (e.g., in the X-direction). In additional embodiments, one or more of conductive line structures 134 may exhibit one or more of at least one different dimension (e.g., a different length, a different width, a different height) and a different shape than one or more other of conductive line structures 134, and/or the spacing (e.g., in the X-direction) between at least two horizontally neighboring conductive line structures 134 may be different than the spacing between at least two other horizontally neighboring conductive line structures 134.

Conductive line structures 134 may be formed of and include conductive material. By way of non-limiting example, conductive line structures 134 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, conductive line structures 134 are each individually formed of and include W. Each of conductive line structures 134 may individually be substantially homogeneous, or one or more of conductive line structures 134 may individually be substantially heterogeneous.

With continued reference to FIG. 1A, contact structures 136 may be formed to vertically extend between and couple conductive line structures 134 and the cell pillar structures 120 (and, hence, the vertically extending strings of memory cells 125). The contact structures 136 may contact (e.g., physical contact, electrical contact) the channel material 124 of the cell pillar structures 120. In some embodiments, portions of the contact structures 136 vertically extend into the cell pillar structures 120. As shown in FIG. 1A, for individual contact structures 136, a vertically lower portion of the contact structure 136 may vertically extend (e.g., in the Z-direction) beyond uppermost vertical boundaries (e.g., uppermost surfaces) of the channel material 124 of an individual cell pillar structure 120, and may be horizontally surrounded by and contact (e.g., physically contact, electrically contact) the channel material 124 of the cell pillar structure 120 at inner horizontal boundaries (e.g., inner sidewalls) of the channel material 124. In addition, for individual contact structures 136, a vertically upper portion of the contact structure 136 may vertically overlie the vertically lower portion of the contact structure 136, and may be located vertically above uppermost vertical boundaries of the cell pillar structure 120 (e.g., uppermost vertical boundaries of the channel material 124 and the outer material stack 122 of the cell pillar structure 120). As shown in FIG. 1A, the vertically upper portion of an individual contact structure 136 may horizontally extend beyond horizontal boundaries of the vertically lower portion of the contact structure 136, and may contact (e.g., physically contact, electrically contact) the channel material 124 of an individual cell pillar structure 120 at the uppermost vertical boundary of the channel material 124.

The contact structures 136 may be formed of and include conductive material. A material composition of the contact structures 136 may be substantially the same as a material composition of the conductive line structures 134, or the material composition of the contact structures 136 may be different than the material composition of the conductive line structures 134. As a non-limiting example, at least a portion (e.g., at least the vertically lower portion) of each of the contact structures 136 may be formed of and include a conductively-doped semiconductive material (e.g., conductively-doped polycrystalline silicon). As another non-limiting example, at least a portion (e.g., at least the vertically upper portion) of each of the contact structures 136 may be formed of and include a metal material comprising one or more of at least one metal, at least one alloy, and at least one conductive metal-containing material (e.g., a conductive metal nitride, a conductive metal silicide, a conductive metal carbide, a conductive metal oxide). Each of the contact structures 136 may individually be substantially homogeneous, or one or more of the contact structures 136 may individually be substantially heterogeneous.

Still referring to FIG. 1A, the second isolation material 138 may be formed of and include at least one insulative material. A material composition of the second isolation material 138 may be substantially the same as a material composition of the first isolation material 108, or the material composition of the second isolation material 138 may be different than the material composition of first isolation material 108. By way of non-limiting example, the second isolation material 138 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the second isolation material 138 is formed of and includes at least one dielectric oxide material (e.g., $SiO_x$, such as $SiO_2$). In additional embodiments, the second isolation material 138 is formed of and includes at least one low-k dielectric material, such as one or more of $SiO_xC_y$, $SiO_xN_y$, $SiC_xO_yH_z$, and $SiO_xC_zN_y$. The second isolation material 138 may be substantially homogeneous, or the second isolation material 138 may be heterogeneous.

Figure 1B:
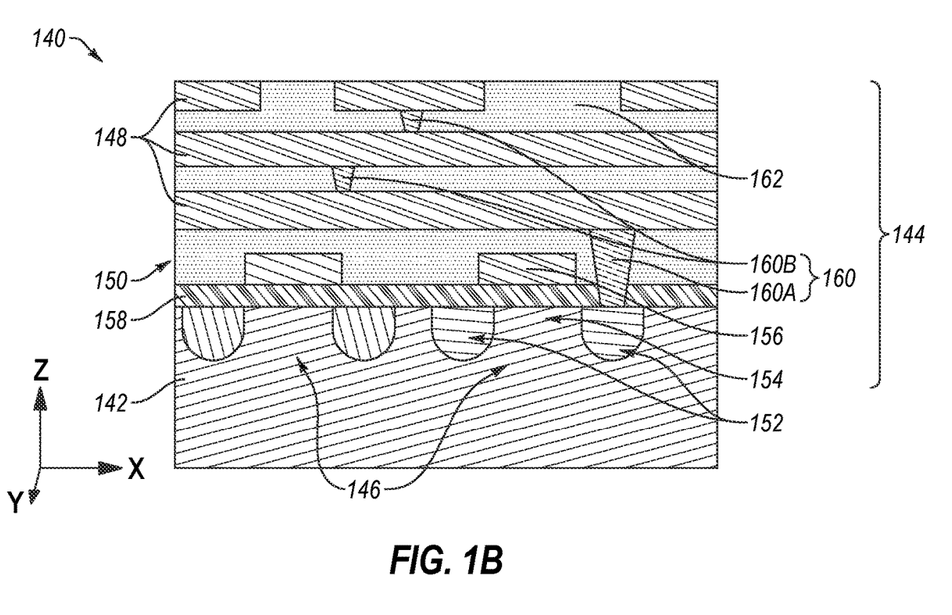

Referring to FIG. 1B, an additional microelectronic device structure 140 to subsequently be attached to the microelectronic device structure 100 (FIG. 1A) may be formed. The additional microelectronic device structure 140 may be formed to include a semiconductive base structure 142, transistors 146, routing structures 148, additional contact structures 160, and a third isolation material 162. The additional microelectronic device structure 140 may form a control logic region 144 of a microelectronic device to subsequently be formed using the additional microelectronic device structure 140 and the microelectronic device structure 100 (FIG. 1A), as described in further detail below. Portions of the semiconductive base structure 142, the transistors 146, the routing structures 148, and the additional contact structures 160 of the additional microelectronic device structure 140 form various control logic devices 150 of the control logic region 144, as also described in further detail below.

The semiconductive base structure 142 (e.g., semiconductive wafer) of the additional microelectronic device structure 140 comprises a base material or construction upon which additional features (e.g., materials, structures, devices) of the additional microelectronic device structure 140 are formed. The semiconductive base structure 142 may comprise a semiconductive structure (e.g., a semiconductive wafer), or a base semiconductive material on a supporting structure. For example, the semiconductive base structure 142 may comprise a conventional silicon substrate (e.g., a conventional silicon wafer), or another bulk substrate comprising a semiconductive material. In some embodiments, the semiconductive base structure 142 comprises a silicon wafer. In addition, the semiconductive base structure 142 may include one or more layers, structures, and/or regions formed therein and/or thereon.

As shown in FIG. 1B, the transistors 146 of the control logic region 144 may be formed to be vertically interposed between the routing structures 148 and underlying portions of the semiconductive base structure 142. The transistors 146 may be formed to include conductively doped regions 152 (e.g., serving as source regions and drain regions of the transistors 146) within the semiconductive base structure 142, channel regions 154 within the semiconductive base structure 142 and individually horizontally interposed between the conductively doped regions 152, and gate structures 156 vertically overlying the channel regions 154. In addition, the additional microelectronic device structure 140 may be formed to include at least one dielectric material 158 (e.g., dielectric oxide material, such as $SiO_2$) vertically interposed between the gate structures 156 and the channel regions 154 of the transistors 146. The dielectric material 158 may be employed a dielectric gate material (e.g., a dielectric oxide gate material) for the transistors 146, and may at least partially (e.g., substantially) horizontally extend on, over, or within the semiconductive base structure 142. As shown in FIG. 1B, in some embodiments, the dielectric material 158 is shared by multiple transistors 146 of the control logic region 144.

For the transistors 146 of the control logic region 144, the conductively doped regions 152 within the semiconductive base structure 142 may be doped with one or more desired dopants. In some embodiments, the conductively doped regions 152 are doped with at least one N-type dopant (e.g., one or more of phosphorus, arsenic, antimony, and bismuth). In some of such embodiments, the channel regions 154 within the semiconductive base structure 142 are doped with at least one P-type dopant (e.g., one or more of boron, aluminum, and gallium). In some other of such embodiments, the channel regions 154 within the semiconductive base structure 142 are substantially undoped. In additional embodiments, the conductively doped regions 152 are doped with at least one P-type dopant (e.g., one or more of boron, aluminum, and gallium). In some of such additional embodiments, the channel regions 154 within the semiconductive base structure 142 are doped with at least one N-type dopant (e.g., one or more of phosphorus, arsenic, antimony, and bismuth). In some other of such additional embodiments, the channel regions 154 within the semiconductive base structure 142 are substantially undoped.

The gate structures 156 may individually horizontally extend (e.g., in the Y-direction) between and be employed by multiple transistors 146 of the control logic region 144. The gate structures 156 may be formed of and include conductive material. The gate structures 156 may individually be substantially homogeneous, or the gate structures 156 may individually be heterogeneous. In some embodiments, the gate structures 156 are each substantially homogeneous. In additional embodiments, the gate structures 156 are each heterogeneous. Individual gate structures 156 may, for example, be formed of and include a stack of at least two different conductive materials.

Still referring to FIG. 1B, the routing structures 148 of the additional microelectronic device structure 140 may be formed to vertically overlie (e.g., in the Z-direction) the transistors 146 of the control logic region 144. As shown in FIG. 1B, in some embodiments, the additional microelectronic device structure 140 is formed to include multiple tiers of the routing structures 148. By way of non-limiting example, the additional microelectronic device structure 140 may be formed to include at least two tiers (e.g., at least three tiers) of the routing structures 148. One or more of the tiers may vertically neighbor one or more other of the tiers. Different tiers of the routing structures 148 may have different configurations (e.g., different features, different feature configurations, different feature arrangements) than one another that together facilitate desirable conductive paths within the additional microelectronic device structure 140.

The routing structures 148 of the additional microelectronic device structure 140 may each individually be formed of and include conductive material. By way of non-limiting example, the routing structures 148 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the routing structures 148 are formed of and include Cu. In additional embodiments, the routing structures 148 are formed of and include W.

Still referring to FIG. 1B, the additional contact structures 160 may include first additional contact structures 160A and second additional contact structures 160B. The first additional contact structures 160A may vertically extend between and couple the transistors 146 to one or more of the routing structures 148. The second additional contact structures 160B may vertically extend between and couple one or more of the routing structures 148 to one or more other of the routing structures 148.

The additional contact structures 160 (including the first additional contact structures 160A and second additional contact structures 160B) may be formed of and include conductive material. In some embodiments, the additional contact structures 160 are formed of and include Cu. In additional embodiments, the additional contact structures 160 are formed of and include W. In further embodiments, the first additional contact structures 160A of the additional contact structures 160 are formed of and include first conductive material (e.g., W); and the second additional contact structures 160B of the additional contact structures 160 are formed of and include a second, different conductive material (e.g., Cu).

As previously mentioned, the transistors 146, the routing structures 148, and the additional contact structures 160 form various control logic devices 150 of the control logic region 144. In some embodiments, the control logic devices 150 comprise complementary-metal-oxide-semiconductor (CMOS) circuitry. The control logic devices 150 may be configured to control various operations of features (e.g., the memory cells 125 (FIG. 1A)) of a microelectronic device (e.g., a memory device, such as a 3D NAND Flash memory device) to subsequently be formed from and using the microelectronic device structure 100 (FIG. 1A) and the additional microelectronic device structure 140 (FIG. 1B), as described in further detail below. As a non-limiting example, the control logic devices 150 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, string drivers, page buffers, and various chip/deck control circuitry. As another non-limiting example, the control logic devices 150 may include devices configured to control column operations for arrays (e.g., memory element array(s), access device array(s)) within the memory array region 104 (FIG. 1A) of the microelectronic device structure 100 (FIG. 1A), such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the control logic devices 150 may include devices configured to control row operations for arrays (e.g., memory element array(s), access device array(s)) within the memory array region 104 (FIG. 1A) of the microelectronic device structure 100 (FIG. 1A), such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices.

Still referring to FIG. 1B, the third isolation material 162 may cover and surround portions of the transistors 146, the routing structures 148, and the additional contact structures 160. The third isolation material 162 may subsequently be attached to the second isolation material 138 (FIG. 1A) of the microelectronic device structure 100 (FIG. 1A) in the process of forming a microelectronic device (e.g., a memory device) using the microelectronic device structure 100 (FIG. 1A) and the additional microelectronic device structure 140, as described in further detail below. A material composition of the third isolation material 162 may be substantially the same as a material composition of the second isolation material 138 (FIG. 1A), or the material composition of the third isolation material 162 may be different than the material composition of the second isolation material 138 (FIG. 1A). By way of non-limiting example, the second isolation material 138 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the second isolation material 138 is formed of and includes at least one dielectric oxide material (e.g., $SiO_x$, such as $SiO_2$). In some embodiments, the third isolation material 162 is formed of and includes at least one dielectric oxide material, such as $SiO_x$ (e.g., $SiO_2$). In additional embodiments, the third isolation material 162 is formed of and includes at least one low-k dielectric material, such as one or more of $SiO_xC_y$, $SiO_xN_y$, $SiC_xO_yH_z$, and $SiO_xC_zN_y$. The third isolation material 162 may be substantially homogeneous, or the third isolation material 162 may be heterogeneous.

Figure 1C:
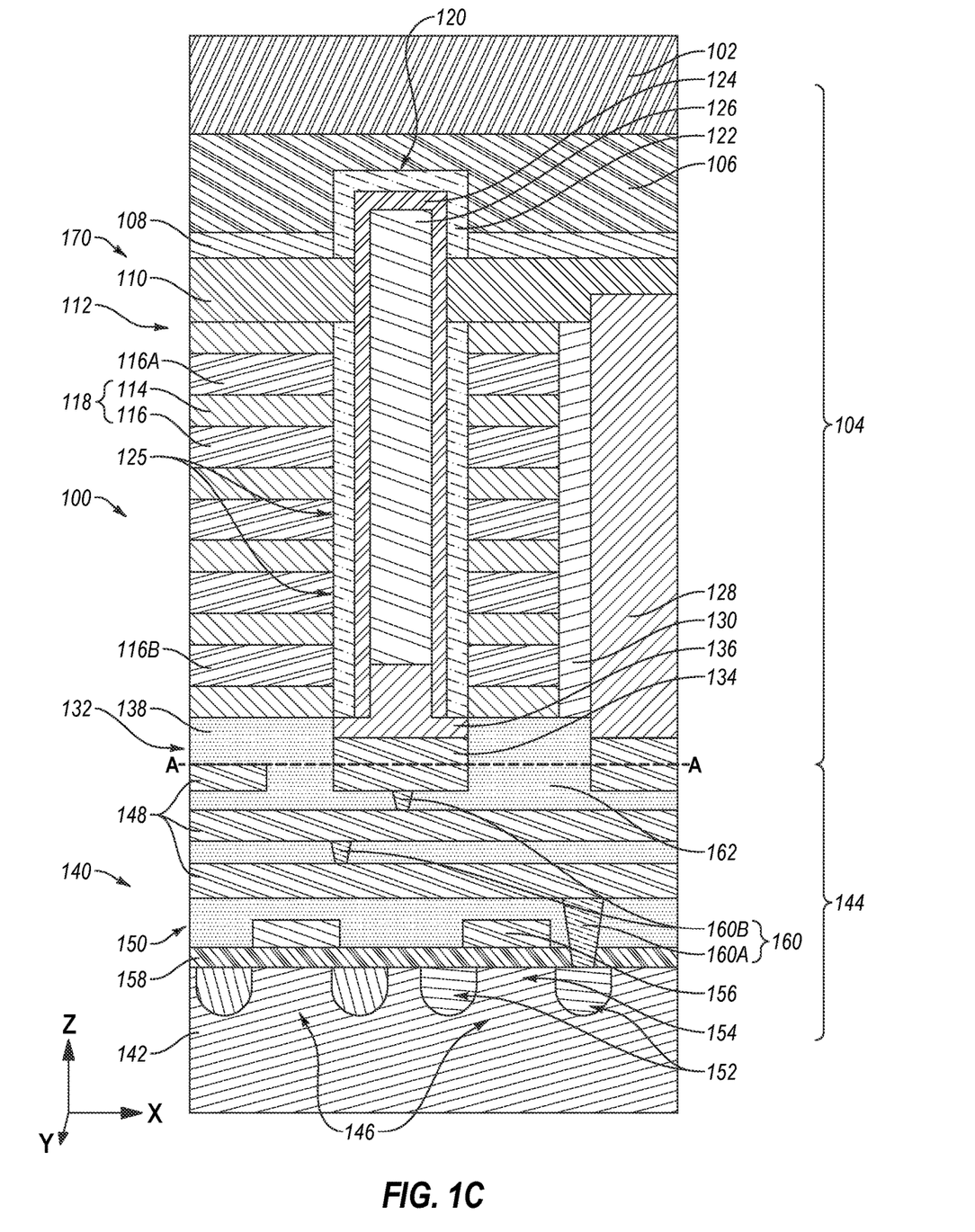

Referring to next to FIG. 1C, following the formation of the microelectronic device structure 100 and the separate formation of the additional microelectronic device structure 140, the microelectronic device structure 100 may be vertically inverted (e.g., flipped upside down in the Z-direction) and attached (e.g., bonded) to the additional microelectronic device structure 140 to form a microelectronic device structure assembly 170. Alternatively, the additional microelectronic device structure 140 may be vertically inverted (e.g., flipped upside down in the Z-direction) and attached to the microelectronic device structure 100 to form the microelectronic device structure assembly 170. The attachment of the microelectronic device structure 100 to the additional microelectronic device structure 140 may couple conductive line structures 134 (e.g., digit line structure) of the memory array region 104 to the routing structures 148 of the control logic region 144. The attachment of the microelectronic device structure 100 to the additional microelectronic device structure 140 may also attach the second isolation material 138 of the microelectronic device structure 100 to the third isolation material 162 of the additional microelectronic device structure 140. In FIG. 1C, vertical boundaries of the microelectronic device structure 100 relative to the additional microelectronic device structure 140 prior to the attachment of the microelectronic device structure 100 to the additional microelectronic device structure 140 to form the microelectronic device structure assembly 170 are depicted by the dashed line A-A. The microelectronic device structure 100 may be attached to the additional microelectronic device structure 140 without a bond line.

Figure 1D:
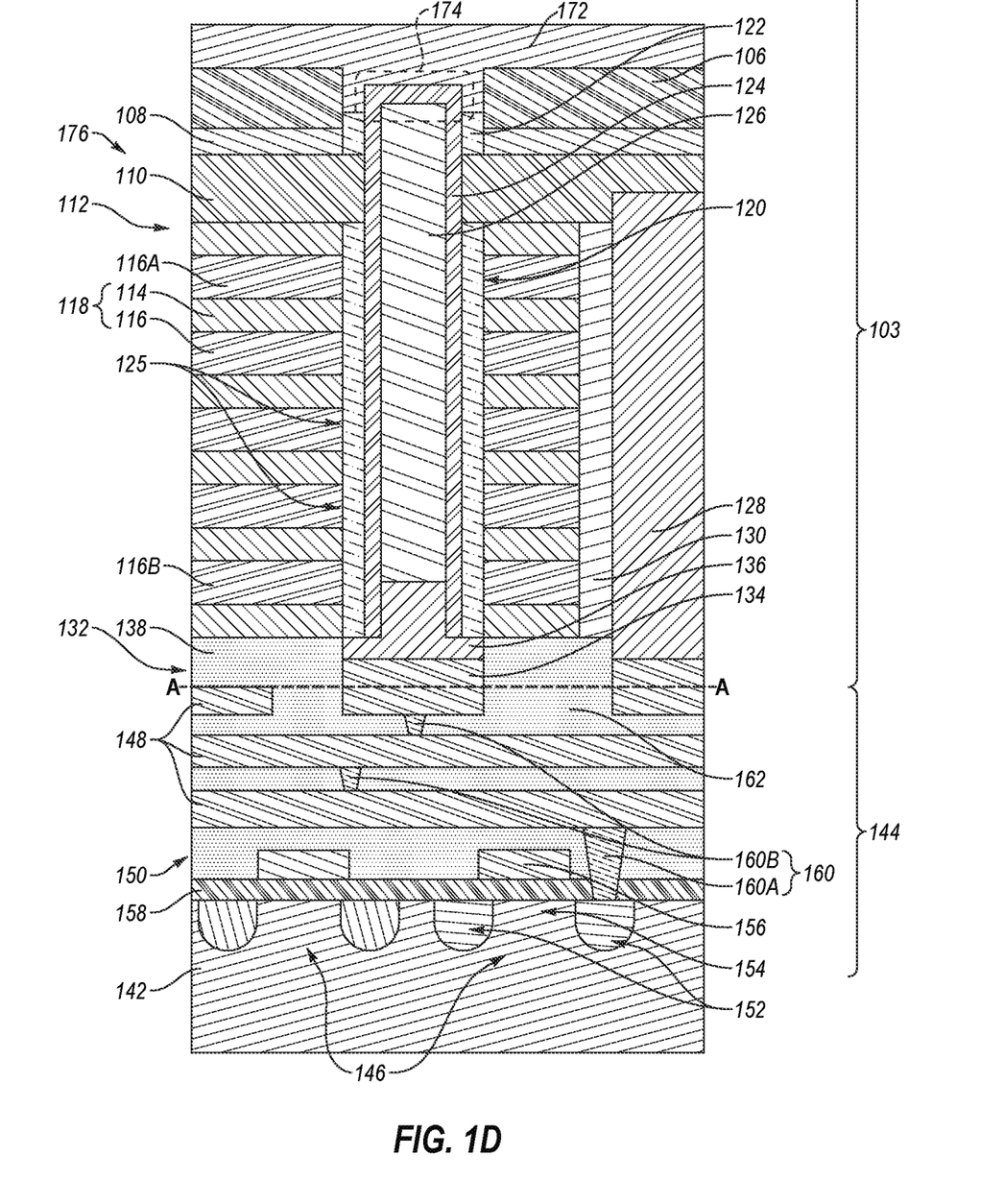

Referring next to FIG. 1D, after attaching the microelectronic device structure 100 (FIG. 1C) to the additional microelectronic device structure 140 (FIG. 1C), the base structure 102 (FIG. 1C), at least a portion of the conductive material 106, and a portion of the outer material stack 122 of each of the cell pillar structures 120 may be removed to expose (e.g., uncover) a portion of the channel material 124 of each of the cell pillar structures 120. Thereafter, a high work function (HWF) metal material 172 may be formed on the exposed portions of the channel material 124, and on remaining portions of the conductive material 106 (if any) and remaining portions of the outer material stack 122 of each of the cell pillar structures 120 to form a microelectronic device 176 configured for body erase operations on the vertically extending strings of memory cells 125. As described in further detail below, the formation of the HWF metal material 172 on the exposed portions of the channel material 124 may form Schottky contacts 174 for body erase operations on the vertically extending strings of memory cells 125 associated with the cell pillar structures 120.

The base structure 102 (FIG. 1C) may be removed using one or more of at least one material removal process (e.g., at least one etching process, such as at least one wet etching process and/or at least one dry etching process; at least one abrading process, such as at least one chemical-mechanical planarization (CMP) process). As a non-limiting example, the base structure 102 (FIG. 1C) may be removed through a wet etching process using at least one wet etchant formulated to etch the base structure 102 (FIG. 1C) at a relatively faster rate than the conductive material 106. In such embodiments, the conductive material 106 may serve as an etch stop material for the wet etching process.

Following the removal of the base structure 102 (FIG. 1C), at least a portion of the conductive material 106 may be removed through an additional material removal process (e.g., at least one abrading process, such as at least one CMP process). As a non-limiting example, the conductive material 106 may subjected to at least one CMP process to reduce a thickness (e.g., vertical dimension in the Z-direction) thereof down to a vertical boundary of the outer material stack 122 of each of the cell pillar structures 120. Following the additional material removal process (e.g., CMP process), an upper vertical boundary of the remaining (e.g., unremoved) portion of the conductive material 106 may be substantially coplanar with an upper vertical boundary of the outer material stack 122 of each of the cell pillar structures 120. As shown in FIG. 1D, in some embodiments, the remaining (e.g., unremoved) portion of conductive material 106 is maintained ahead of forming the HWF metal material 172, such that the remaining portion of conductive material 106 vertically intervenes between the HWF metal material 172 and the first isolation material 108. In additional embodiments, the conductive material 106 is substantially removed before forming the HWF metal material 172, such that the HWF metal material 172 is formed on the first isolation material 108.

After removing at least a portion of the conductive material 106 to expose (e.g., uncover) the outer material stack 122 of each of the cell pillar structures 120, portions of the outer material stack 122 may be removed through a further material removal process (e.g., at least one etching process, such as at least one dry etching process and/or at least one wet etching process) to expose (e.g., uncover) portions of the channel material 124 thereunder. As shown in FIG. 1D, the further material removal process may remove portions of the outer material stack 122 of each of the cell pillar structures 120 vertically overlying the first isolation material. The further material removal process may expose upper surfaces and upper portions of side surfaces of the channel material 124 of the cell pillar structures 120. An upper vertical boundary of a remaining (e.g., unremoved) portion of the outer material stack 122 of the each of the cell pillar structures 120 may be located above, at, or within vertical boundaries of the first isolation material 108 (e.g., at or within vertical boundaries of a remaining portion of the conductive material 106).

Optionally, the remaining portion of the conductive material 106 may be annealed (e.g., thermally annealed) before and/or after the formation of the HWF metal material 172. Annealing the conductive material 106 may, for example, change active dopant concentrations within the remaining portion of the conductive material 106 and/or may enhance desirable surface characteristics (e.g., surface smoothness) for the remaining portion of the conductive material 106.

Still referring to FIG. 1D, the HWF metal material 172 may be formed on exposed portions of the channel material 124 of each of the cell pillar structures 120. The HWF metal material 172 may be formed on upper surfaces and upper portions of the side surfaces of the channel material 124 of the cell pillar structures 120. In addition, the HWF metal material 172 may also be formed on upper surfaces of the remaining (e.g., unremoved) portion of the outer material stack 122 of the each of the cell pillar structures 120, and on upper surfaces and side surfaces of remaining portions of the conductive material 106 (if any, or the first isolation material 108 if the conductive material 106 has previously been substantially removed). As shown in FIG. 1D, a lower vertical boundary of the HWF metal material 172 may have a non-planar geometry corresponding to (e.g., mirroring) a topography at least partially defined by the remaining portions of the cell pillar structures 120 and the conductive material 106 (if any), or corresponding to a topography at least partially defined by the cell pillar structures 120 and the first isolation material 108 if the conductive material 106 has previously been substantially removed. In addition, an upper vertical boundary of the HWF metal material 172 may be formed to be substantially planar.

The HWF metal material 172 may comprise a metal material (e.g., one or more of a metal; an alloy; and a conductive metal-containing material, such one or more of a conductive metal nitride, a conductive metal silicide, a conductive metal carbide) having a work function (WF) greater than or equal to about 4.7 electronvolts (eV). By way of non-limiting example, the HWF metal material 172 may be formed of and include one or more of tungsten (W), gold (Au), palladium (Pd), nickel (Ni), copper (Cu), cobalt (Co), iridium (Jr), platinum (Pt), ruthenium (Ru), tantalum (Ta), molybdenum (Mo), tungsten silicide ($WSi_x$), tungsten nitride ($WN_x$), tantalum nitride ($TaN_x$), tantalum silicide ($TaSi_x$), titanium nitride ($TiN_x$), titanium silicide ($TiSi_x$), cobalt silicide ($CoSi_x$), molybdenum nitride ($MoN_x$), and molybdenum silicide ($MoSi_x$). In some embodiments, the HWF metal material 172 is formed of and includes W.

The HWF metal material 172 and the remaining portion (if any) of the conductive material 106 may be shorted together. The HWF metal material 172 and the remaining portion (if any) of the conductive material 106 may effectively form an active body for an array of the vertically extending strings of memory cells 125. In embodiments wherein the conductive material 106 has been substantially removed, the HWF metal material 172 may alone serve as the active body for the array of the vertically extending strings of memory cells 125.

Forming the HWF metal material 172 on the channel material 124 of each of the cell pillar structures 120 forms Schottky contacts 174 having rectifying characteristics at junctions of the HWF metal material 172 and the channel material 124 of each of the cell pillar structures 120. The Schottky contacts 174 may facilitate body erase operations on the vertical extending strings of memory cells 125. During erase operations, the Schottky contacts 174 may be biased, at least partially based on the work function (e.g., greater than or equal to 4.7 eV) of the HWF metal material 172, with a voltage (e.g., greater than or equal to 3 volts (V)) sufficient to effectuate a predetermined erase current (which can be a few nanoamperes (nA) per cell pillar structure 120).

The configuration of the microelectronic device 176 facilitates body erase operations on the vertical extending strings of memory cells 125 thereof while also permitting the control logic region 144 thereof to be positioned vertically under the memory array region 103 thereof. Body erase operations offer advantages over gate-induce-drain-leakage (GIDL)-assisted erase operations, such as relatively relaxed margins for SGS (e.g., the first conductive structure 116A) and SGD (e.g., the second conductive structures 116B) on current ($I_{on}$) and off current ($I_{off}$), and relatively reduced SGS and SGD trapping during erase operations (e.g., since a relatively large bias offset between SGS/SGD and source/digit lines are not necessary). Furthermore, unlike conventional microelectronic devices designed for body erase operations, the microelectronic device 176 does not require epitaxial semiconductor material (e.g., epitaxial silicon) vertically underlying and in contact with cell pillar structures to facilitate body erase operations. Accordingly, the microelectronic device 176 may exhibit a so-called CMOS under array ("CuA") configuration (or a so-called CMOS above array ("CaA") configuration) rather the so-called CMOS outside array ("CoA") configurations exhibited by conventional microelectronic devices designed for body erase operations.

Thus, a microelectronic device according to embodiments of the disclosure comprises a stack structure, cell pillar structures, an active body structure, digit line structures, and control logic devices. The stack structure comprises vertically neighboring tiers, each of the vertically neighboring tiers comprising a conductive structure and an insulative structure vertically neighboring the conductive structure. The cell pillar structures vertically extend through the stack structure and each comprise a channel material and an outer material stack horizontally interposed between the channel material and the stack structure. The active body structure vertically overlies the stack structure and is in contact with the channel material of the cell pillar structures. The active body structure comprises a metal material having a work function greater than or equal to about 4.7 electronvolts. The digit line structures vertically underlie the stack structure and are coupled to the cell pillar structures.

Furthermore, in accordance with embodiments of the disclosure, a method of forming microelectronic device comprises forming a first microelectronic device structure comprising control logic devices. A second microelectronic device structure is formed to comprise a base structure; a doped semiconductive material overlying the base structure; a stack structure overlying the doped semiconductive material and comprising vertically alternating conductive structures and insulating structures; cell pillar structures vertically extending through the stack structure and into the doped semiconductive material, the cell pillar structures each comprising a semiconductive channel material surrounded by an outer material stack; and digit line structures vertically overlying the stack structure and coupled to the cell pillar structures. The second microelectronic device structure is attached to the first microelectronic device structure to form a microelectronic device structure assembly, the digit line structures vertically interposed between the stack structure and the control logic devices within the microelectronic device structure assembly. The base structure and portions of the doped semiconductive material and the outer material stack of the cell pillar structures are removed to expose portions of the semiconductive channel material of the cell pillar structures. A metal material is formed on the exposed portions of the semiconductive channel material of the cell pillar structures, the metal material having a work function greater than or equal to about 4.7 electronvolts.

Moreover, a memory device according to embodiments of the disclosure comprises a memory array region and a control logic region vertically underlying the memory array region. The memory array region comprises a stack structure, a lateral contact structure, an active body structure, digit line structures, and cell pillar structures. The stack structure comprises a vertically alternating sequence of conductive structures and insulating structures. The lateral contact structure overlies the stack structure. The active body structure overlies the lateral contact structure and comprises a metal material having a work function greater than or equal to about 4.7 electronvolts. The digit line structures underlie the stack structure. The cell pillar structures vertically extend from the metal material of the active body structure, through the lateral contact structure and the stack structure, and to the digit line structures. Each of the cell pillar structures comprises a semiconductive channel material in contact with the metal material of the active body structure, the lateral contact structure, and one of the digit line structures. The control logic region comprises CMOS circuitry in electrical communication with the active body structure, the lateral contact structure, the digit line structures, and the conductive structures of the stack structure.

Figure 2:
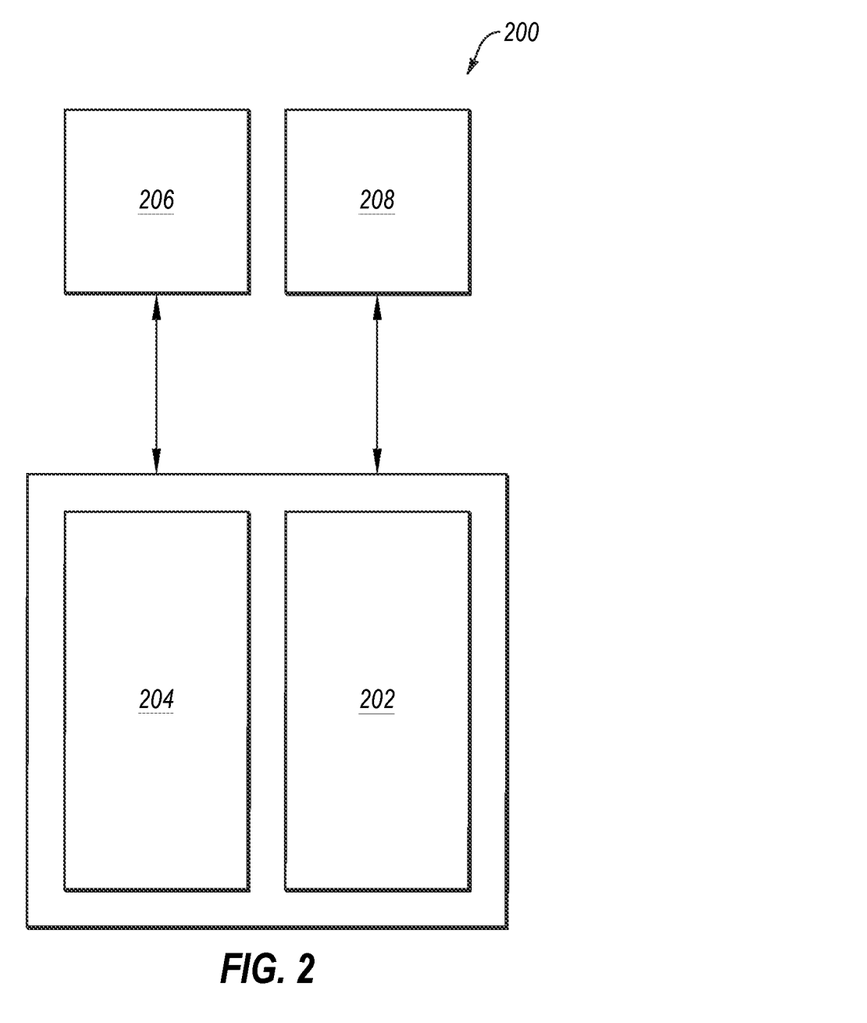
FIG. 2 is a schematic block diagram of an electronic system, in accordance with an embodiment of the disclosure.

Microelectronic devices (e.g., the microelectronic device 176 (FIG. 1D)) in accordance with embodiments of the disclosure may be used in embodiments of electronic systems of the disclosure. For example, FIG. 2 is a block diagram of an illustrative electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 200 includes at least one memory device 202. The memory device 202 may comprise, for example, a microelectronic device (e.g., the microelectronic device 176 (FIG. 1D)) previously described herein. The electronic system 200 may further include at least one electronic signal processor device 204 (often referred to as a "microprocessor"). The electronic signal processor device 204 may, optionally, include a microelectronic device (e.g., the microelectronic device 176 (FIG. 1D)) previously described herein. While the memory device 202 and the electronic signal processor device 204 are depicted as two (2) separate devices in FIG. 2, in additional embodiments, a single (e.g., only one) memory/processor device having the functionalities of the memory device 202 and the electronic signal processor device 204 is included in the electronic system 200. In such embodiments, the memory/processor device may include a microelectronic device (e.g., the microelectronic device 176 (FIG. 1D)) previously described herein. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touchscreen device that can be used both to input information to the electronic system 200 and to output visual information to a user. The input device 206 and the output device 208 may communicate electrically with one or more of the memory device 202 and the electronic signal processor device 204.

Thus, an electronic system according to embodiments of the disclosure comprises an input device, an output device, a processor device operably coupled to the input device and the output device, and a memory device operably coupled to the processor device. The memory device comprises a stack structure, an active body structure, a lateral contact structure, digit lines, cell pillar structures, and control logic circuitry. The stack structure comprises tiers each comprising a conductive structure and an insulative structure vertically neighboring the conductive structure. The active body structure overlies the stack structure and comprises a conductive material having a work function greater than or equal to 4.7 electronvolts. The lateral contact structure comprises additional conductive material interposed between the stack structure and the active body structure. The digit lines underlie the stack structure. The cell pillar structures extend through stack structure and are in contact with the active body structure, the lateral contact structure, and the digit lines. Each of the cell pillar structures comprises a semiconductive material contacting the conductive material of the active body structure to form a Schottky contact at a junction between the semiconductive material and the conductive material. The control logic circuitry underlies the digit lines and is electrically connected to the digit lines, the lateral contact structure, and the active body structure.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
    forming a first microelectronic device structure comprising control logic devices;
    forming a second microelectronic device structure comprising:
        a base structure;
        a doped semiconductive material overlying the base structure;
        a stack structure overlying the doped semiconductive material and comprising vertically alternating conductive structures and insulating structures;
        cell pillar structures vertically extending through the stack structure and into the doped semiconductive material, the cell pillar structures each comprising a semiconductive channel material surrounded by an outer material stack; and
        digit line structures vertically overlying the stack structure and coupled to the cell pillar structures;
    attaching the second microelectronic device structure to the first microelectronic device structure to form a microelectronic device structure assembly, the digit line structures vertically interposed between the stack structure and the control logic devices within the microelectronic device structure assembly;
    removing the base structure and portions of the doped semiconductive material and the outer material stack of the cell pillar structures to expose portions of the semiconductive channel material of the cell pillar structures; and
    forming a metal material on the exposed portions of the semiconductive channel material of the cell pillar structures, the metal material having a work function greater than or equal to about 4.7 electronvolts.

2. The method of claim 1, wherein forming the second microelectronic device structure comprises forming the second microelectronic device structure to further comprise a conductive lateral contact structure vertically between the stack structure and the doped semiconductive material, the conductive lateral contact structure horizontally extending through the outer material stack of each of the cell pillar structures and contacting the semiconductive channel material of each of the cell pillar structures.

3. The method of claim 1, wherein attaching the second microelectronic device structure to the first microelectronic device structure comprises:
    vertically inverting one of the second microelectronic device structure and the first microelectronic device structure relative to an other of the second microelectronic device structure and the first microelectronic device structure; and coupling the digit line structures of the second microelectronic device structure to conductive routing structures operatively associated with the control logic devices.

4. The method of claim 1, wherein removing the base structure and portions of the doped semiconductive material and the outer material stack of the cell pillar structures comprises:
wet etching the base structure to expose the doped semiconductive material;
abrading the doped semiconductive material to remove a portion thereof and partially expose the outer material stack of the cell pillar structures; and
etching exposed portions of the outer material stack of the cell pillar structures to expose the portions of the semiconductive channel material of the cell pillar structures.

5. The method of claim 4, wherein etching exposed portions of the outer material stack of the cell pillar structures comprises uncovering upper surfaces and upper portions of sides surfaces of the semiconductive channel material of the cell pillar structures.

6. The method of claim 1, further comprising forming the outer material stack of each of the cell pillar structures to comprise:
a tunnel dielectric material outwardly surrounding the semiconductive channel material;
a charge-trapping material outwardly surrounding the tunnel dielectric material; and
a charge-blocking material outwardly surrounding the charge-trapping material.

7. The method of claim 1, wherein forming a first microelectronic device structure comprising control logic devices comprises forming the control logic devices to comprise complementary-metal-oxide-semiconductor (CMOS) circuitry.

8. The method of claim 1, wherein forming a second microelectronic device structure comprises selecting the doped semiconductive material to have a relatively lower etching rate than the base structure during mutual exposure to a wet etchant.

9. The method of claim 1, wherein attaching the second microelectronic device structure to the first microelectronic device structure comprises:
bonding conductive material of the digit line structures of the second microelectronic device structure to additional conductive material of routing structures of the first microelectronic device structure; and
bonding oxide dielectric material horizontally surrounding the digit line structures of the second microelectronic device structure to additional oxide dielectric material horizontally surrounding the routing structures of the first microelectronic device structure.

10. The method of claim 1, wherein forming a metal material on the exposed portions of the semiconductive channel material of the cell pillar structures comprises forming the metal material on each of:
upper surfaces and outer side surfaces of the semiconductive channel material of the cell pillar structures;
upper surfaces of remaining portions of the outer material stack; and
an upper surface of a remaining portion of the doped semiconductive material.

11. The method of claim 1, wherein:
removing the base structure and portions of the doped semiconductive material and the outer material stack of the cell pillar structures comprises substantially completely removing the doped semiconductive material to expose isolation material horizontally adjacent the outer material stack of the cell pillar structures; and
forming a metal material on the exposed portions of the semiconductive channel material of the cell pillar structures comprises forming the metal material on surfaces of each of the isolation material, the semiconductive channel material, and remaining portions of the outer material stack.

12. A method of forming a microelectronic device, comprising:
forming a microelectronic device structure comprising:
a stack structure comprising conductive material and insulative material vertically alternating with the conductive material;
a conductive lateral contact structure vertically neighboring the stack structure;
cell pillar structures vertically extending through the stack structure and the conductive lateral contact structure, the cell pillar structures individually comprising:
an outer material stack having an outer sidewall in physical contact with the stack structure; and
channel material having an outer side surface in physical contact each of the conductive lateral contact structure and an inner sidewall of the outer material stack;
a conductive deep contact structure vertically extending through the stack structure and coupled to the conductive lateral contact structure; and
conductive line structures vertically neighboring the stack structure and coupled to the cell pillar structures;
forming an additional microelectronic device structure comprising complementary-metal-oxide-semiconductor (CMOS) circuitry;
bonding the microelectronic device structure to the additional microelectronic device structure to form an assembly including the conductive line structures vertically between the stack structure and the CMOS circuitry; and
forming a high work function (HWF) metal material in physical contact with the channel material of the cell pillar structures after bonding the microelectronic device structure to the additional microelectronic device structure.

13. The method of claim 12, wherein forming a microelectronic device structure comprises forming the microelectronic device structure to further comprise:
a base structure;
doped semiconductive material vertically between the base structure and the conductive lateral contact structure, the doped semiconductive material in physical contact with the outer material stack of the cell pillar structures; and
isolation material vertically between the doped semiconductive material and the conductive lateral contact structure, the isolation material in physical contact with the outer material stack of the cell pillar structures.

14. The method of claim 13, further comprising:
selecting the doped semiconductive material to comprise polycrystalline silicon doped with at least one P-type dopant; and
selecting the conductive lateral contact structure to comprise additional polycrystalline silicon doped with at least one N-type dopant.

15. The method of claim 13, wherein forming a HWF metal material in physical contact with the channel material of the cell pillar structures comprises:
removing the base structure after bonding the microelectronic device structure to the additional microelectronic device structure;
at least partially removing the doped semiconductive material after removing the base structure;
removing portions of the outer material stack of the cell pillar structures uncovered by at least partially removing doped semiconductive material to expose portions of the channel material of the cell pillar structures; and
forming the HWF metal material in physical contact with the exposed portions of the channel material.

16. The method of claim 12, wherein bonding the microelectronic device structure to the additional microelectronic device structure comprises bonding the conductive line structures of the microelectronic device structure to conductive routing structures coupled to the CMOS circuitry of the additional microelectronic device structure.

17. The method of claim 12, wherein forming HWF metal material comprises selecting the HWF metal material to comprises one or more of tungsten, gold, palladium, nickel, copper, cobalt, iridium, platinum, ruthenium, tantalum, molybdenum, tungsten silicide, tungsten nitride, tantalum nitride, tantalum silicide, titanium nitride, titanium silicide, cobalt silicide, molybdenum nitride, and molybdenum silicide.

18. A method of forming a microelectronic device, comprising:
forming a first structure having control logic devices comprising complementary-metal-oxide-semiconductor (CMOS) circuitry;
forming a second structure comprising:
a base structure;
doped polycrystalline silicon comprising at least one P-type dopant overlying the base structure;
additional doped polycrystalline silicon comprising at least one N-type dopant overlying the doped polycrystalline silicon;
a stack structure overlying the additional doped polycrystalline silicon and comprising tiers individually including conductive material vertically adjacent insulative material;
pillars vertically extending through the stack structure and the additional doped polycrystalline silicon into the doped polycrystalline silicon, the pillars individually comprising:
channel material comprising semiconductor material; and
an outer stack structure horizontally surrounding the channel material; and
conductive line structures overlying the stack structure and coupled to the pillars;
bonding dielectric oxide material of the first structure to additional dielectric oxide material of the second structure to form an assembly including the conductive line structures vertically interposed between the stack structure and the control logic devices;
subjecting the assembly to at least one material removal process to remove the base structure, at least some of the doped polycrystalline silicon, and portions of and the outer stack structure of each of the pillars; and
forming an active body structure comprising a metal material having a work function greater than or equal to about 4.7 electronvolts in physical contact with the channel material of the pillars after subjecting the assembly to the at least one material removal process, junctions between the channel material of the pillars and the metal material of the active body structure forming Schottky contacts.

19. The method of claim 18, wherein subjecting the assembly to at least one material removal process comprises:
completely removing the base structure using a wet etching process;
partially removing the doped polycrystalline silicon using a chemical-mechanical planarization (CMP) process; and
partially removing the outer stack structure of each of the pillars using an additional etching process.

20. The method of claim 18, further comprising thermally annealing a remaining portion of the doped polycrystalline silicon after subjecting the assembly to the at least one material removal process.

* * * * *

UNITED STATES PATENT AND TRADEMARK OFFICE
CERTIFICATE OF CORRECTION

PATENT NO. : 11,770,932 B2
APPLICATION NO. : 18/045417
DATED : September 26, 2023
INVENTOR(S) : Haitao Liu and Kunal R. Parekh Page 1 of 1

It is certified that error appears in the above-identified patent and that said Letters Patent is hereby corrected as shown below:

In the Specification

| | | |
|---|---|---|
| Column 4, | Line 45, | change "iridium (Jr)," to --iridium (Ir),-- |
| Column 10, | Line 65, | change "(metal-oxide-nitride-oxide-semiconductor)" to --(metal - oxide - nitride - oxide - semiconductor)-- |
| Column 10, | Line 67, | change "(tantalum nitride-aluminum oxide-ni-" to --(tantalum nitride - aluminum oxide - ni- -- |
| Column 11, | Line 1, | change "tride-oxide-semiconductor)" to --tride - oxide - semiconductor)-- |
| Column 11, | Line 51, | change "and a $MgO_x$, at" to --and a $MgO_x$), at-- |
| Column 19, | Line 2, | change "iridium (Jr)," to --iridium (Ir),-- |

Signed and Sealed this
Nineteenth Day of March, 2024

Katherine Kelly Vidal
*Director of the United States Patent and Trademark Office*